(12) United States Patent
Silberbauer (10) Patent No.: US 11,450,449 B2
(45) Date of Patent: Sep. 20, 2022

(54) METHOD FOR STRIPPING PART OF A SHIELDING FOIL OF A SHEATHED CABLE AND FOIL REMOVING DEVICE FOR STRIPPING PART OF A SHIELDING FOIL OF A SHEATHED CABLE FROM THE SHEATHED CABLE AT A PREDETERMINED BREAKING POINT

(71) Applicant: KOMAX HOLDING AG, Dierikon (CH)

(72) Inventor: Günther Silberbauer, Eging am See (DE)

(73) Assignee: KOMAX HOLDING AG, Dierikon (CH)

( * ) Notice: Subject to any disclaimer, the term of this patent is extended or adjusted under 35 U.S.C. 154(b) by 267 days.

(21) Appl. No.: 16/108,136

(22) Filed: Aug. 22, 2018

(65) Prior Publication Data

US 2019/0066869 A1 Feb. 28, 2019

(30) Foreign Application Priority Data

Aug. 23, 2017 (EP) ..................................... 17187490

(51) Int. Cl.
*H01B 7/00* (2006.01)
*H05K 9/00* (2006.01)
*H02G 1/12* (2006.01)

(52) U.S. Cl.
CPC ........... *H01B 7/0018* (2013.01); *H02G 1/128* (2013.01); *H02G 1/1212* (2013.01); *H02G 1/1282* (2013.01); *H05K 9/0098* (2013.01)

(58) Field of Classification Search
CPC .... H01B 7/0018; H02G 1/1212; H02G 1/128; H02G 1/1282; H05K 9/0098
(Continued)

(56) References Cited

U.S. PATENT DOCUMENTS 3,853,156 A * 12/1974 Folkenroth .......... H02G 1/1292
140/149
4,046,298 A * 9/1977 Schroeder, Jr. ........ G02B 6/245
225/2
(Continued)

FOREIGN PATENT DOCUMENTS

DE 202006003872 U1 7/2007
EP 1641572 B1 12/2011
(Continued)

*Primary Examiner* — Hadi Shakeri
(74) *Attorney, Agent, or Firm* — William J. Clemens; Shumaker, Loop & Kendrick, LLP (57) ABSTRACT

A method for stripping a part of a shielding foil of a sheathed cable includes the following steps: provide the sheathed cable with the shielding foil that has a predetermined breaking point running along a circumference of the shielding foil; bend a subarea of the sheathed cable with the shielding foil in a first direction to apply a tearing stress at the predetermined breaking point that tears the shielding foil on a part of the circumference of the shielding foil; move a first part of the sheathed cable in an elliptical, particularly circular, movement to apply the tearing stress across essentially the entire circumference of the shielding foil, so that the shielding foil tears at the predetermined breaking point across the entire circumference of the shielding foil; and remove from the sheathed cable the part of the shielding foil that was stripped from the sheathed cable.

17 Claims, 6 Drawing Sheets

(58) Field of Classification Search
USPC .......................................................... 81/9.43
See application file for complete search history.

(56) References Cited

U.S. PATENT DOCUMENTS

| | | | | |
|---|---|---|---|---|
| 4,092,880 | A * | 6/1978 | Kaufmann | ............ H02G 1/1212 |
| | | | | 81/9.42 |
| 4,377,250 | A * | 3/1983 | Muerkl | .................... G02B 6/25 |
| | | | | 225/2 |
| 4,719,697 | A * | 1/1988 | Schwartzman | ........ H01R 43/05 |
| | | | | 29/867 |
| 4,852,244 | A * | 8/1989 | Lukas | .................... G02B 6/245 |
| | | | | 29/566.3 |
| 5,142,121 | A * | 8/1992 | Ezaki | ..................... H02G 1/128 |
| | | | | 219/121.85 |
| 5,787,574 | A * | 8/1998 | Watanabe | ............ H02G 1/1256 |
| | | | | 174/28 |
| 6,509,547 | B1 | 1/2003 | Bernstein et al. | |
| 6,631,554 | B1 | 10/2003 | Sato et al. | |
| 7,947,921 | B2 | 5/2011 | McFall et al. | |
| 8,302,295 | B2 | 11/2012 | Tanaka | |
| 8,827,216 | B2 * | 9/2014 | Brown | ................. F16M 11/123 |
| | | | | 248/124.1 |
| 2008/0098598 | A1 | 5/2008 | McFall et al. | |
| 2015/0162729 | A1 | 6/2015 | Reversal et al. | |

FOREIGN PATENT DOCUMENTS

| | | |
|---|---|---|
| EP | 3104471 A1 | 9/2015 |
| EP | 3089294 A1 | 11/2016 |
| JP | 3469398 B2 | 11/2003 |
| WO | 2008084216 A1 | 7/2008 |
| WO | 2011054697 A1 | 12/2011 |
| WO | 2013142566 A1 | 9/2013 |
| WO | 2014001716 A1 | 1/2014 |
| WO | 2015125129 A1 | 8/2015 |

* cited by examiner

METHOD FOR STRIPPING PART OF A SHIELDING FOIL OF A SHEATHED CABLE AND FOIL REMOVING DEVICE FOR STRIPPING PART OF A SHIELDING FOIL OF A SHEATHED CABLE FROM THE SHEATHED CABLE AT A PREDETERMINED BREAKING POINT

FIELD

The present invention relates to a method for stripping part of a shielding foil of a sheathed cable and a foil removing device for stripping part of a shielding foil of a sheathed cable from the sheathed cable at a predetermined breaking point.

BACKGROUND

The shielding foil of a sheathed cable that protects the inside wires from alternating electrical fields often must be cleanly, i.e., without the formation of tape flags, stripped from the sheathed cable and removed.

JP 3 469 398 B2 describes a device that perforates the shielding foil through the outer sheath of the sheathed cable with needles. At the same time, the outer sheath is stripped at a different position. After having been treated, the outer sheath and the shielding foil are stripped from the remaining sheathed cable together. In this process, the shielding foil tears at the perforation. The disadvantage of this is that, especially if the shielding foil consists for example of plastic with an evaporated metal layer, the formation of tape flags may occur.

WO 2015/125 129 A describes a method for removing a shielding foil. When the shielding foil consists of metalized plastic, the successful creation of a shear fracture or shear crack is not or respectively cannot be guaranteed due to the tensile properties of the shielding foil. Consequently, a formation of tape flags cannot safely be ruled out.

WO 2014/001 716 A1 discloses a device in which the shielding foil is stripped across the entire circumference by means of a laser beam, while the insulation layer of the inner wires or lines, respectively, is not damaged by laser beam. A disadvantage of this is that the stripping or the removal of the shielding foil takes a very long time.

Further prior art is known from U.S. Pat. No. 6,631,554 B1, U.S. Pat. No. 8,302,295 B2, WO 2008/084 216 A1, EP 2 828 030 A1, U.S. Pat. No. 7,947,921 B2, U.S. Pat. No. 6,509,547 B1 and EP 1 641 572 B1.

There may be a need for a method for stripping part of a shielding foil of a sheathed cable or, respectively, a foil removing device for stripping part of a shielding foil of a sheathed cable from the sheathed cable at a predetermined breaking point, with which the shielding foil can be quickly stripped and/or removed in a technically simple manner without the formation of tape flags.

SUMMARY

Such a need may be filled by a method for stripping part of a shielding foil of a sheathed cable or respectively a foil removing device for stripping part of a shielding foil of a sheathed cable from the sheathed cable at a predetermined breaking point according to the following description.

According to a first aspect of the invention, a method for removing part of a shielding foil of a sheathed cable is proposed, wherein the method comprises the following steps: provide the sheathed cable with the shielding foil, whereby the shielding foil comprises a predetermined breaking point that essentially runs along a circumference of the shielding foil; bend a subarea of the sheathed cable with the shielding foil in a first direction to apply such a tearing stress at the predetermined breaking point on a part of the circumference of the shielding foil that the shielding foil tears at the predetermined breaking point on a part of the circumference of the shielding foil; move a first part of the sheathed cable in an essentially elliptical, in particular circular movement to apply a tearing stress across essentially the entire circumference of the shielding foil, so that the shielding foil tears at the predetermined breaking point across the entire circumference of the shielding foil; and remove from the sheathed cable the part of the shielding foil that was stripped from the sheathed cable.

One advantage of this is that the formation of tape flags is safely avoided. This means that it is certain that the shielding foil tears exclusively along the predetermined breaking point and that no tear is formed at any other position. Furthermore, the method can be executed quickly, because the elliptical movement can be performed very quickly. Furthermore, the method is particularly simple from a technical perspective.

According to a second aspect of the invention, a foil removal device for removing part of a shielding foil of a sheathed cable from the sheathed cable at a predetermined breaking point is proposed with the removal device comprising the following: —a bending gripper for gripping a first part of the sheathed cable and retaining the gripped first part of the sheathed cable so that the sheathed cable is in an at least partially bent state, so that such a tearing stress is applied at the predetermined breaking point to a part of the circumference of the shielding foil that the shielding foil tears at the predetermined breaking point on part of the circumference of the shielding foil; and —a turning device for turning the bending gripper so that the first part of the sheathed cable is moved along an elliptical, in particular circular path to create a tearing stress across essentially the entire circumference of the shielding foil, so that the shielding foil tears at the predetermined breaking point across the entire circumference of the shielding foil.

What is advantageous here is that when the shielding foil is stripped from the sheathed cable by means of the foil removal device, the formation of a tape flag is safely avoided. This means that it is certain that the shielding foil tears exclusively along the predetermined breaking point and that no tear is formed at any other position. Furthermore, the foil removal device makes it possible to strip and/or remove the shielding foil very quickly from the sheathed cable. The foil removal device can be produced in a particularly cost-efficient manner as well.

Possible features and advantages of embodiments of the invention may be considered, inter alia, and without limiting the invention, based on the ideas and findings described below.

According to one embodiment, the first part of the sheathed cable is moved in an elliptical, in particular circular, movement in a direction of rotation, which is contrary to a winding direction of the shielding foil along a circumference of the sheathed cable. One advantage of this is that, particularly when the inner part of the shielding foil has a poorer perforation in the overlapping area than the outer part of the shielding foil, the tear at the predetermined breaking point is reliably transferred to the inner part of the shielding foil. Consequently, the formation of tape flags is prevented with even greater certainty, even in the overlapping area of the shielding foil.

According to one embodiment, before the step in which the first part of the sheathed cable is moved in an elliptical movement is taken, the shielding foil is prestressed in the longitudinal direction of the sheathed cable. This guarantees even more reliably that the shielding foil tears along the predetermined breaking point. Furthermore, the bending angle or the angle of the twist with which the sheathed cable is bent can be low, or small, respectively. Consequently, the method can be performed on a sheathed cable that has a particularly sensitive response to being bent without any unintended damage being caused to the sheathed cable.

According to one embodiment, a length of a bending section in which the sheathed cable is bent by the elliptical movement of the first part of the sheathed cable and/or a bending angle in which the sheathed cable is bent by the elliptical movement of the first part of the sheathed cable is adapted to the characteristics of the on-metallic sheathed cable. This way, the sheathed cable is treated in a particularly careful manner while part of the shielding foil is removed. This prevents unintended damage to the sheathed cable. The characteristics of the sheathed cable may include, for example, a bending stiffness of the sheathed cable.

According to one embodiment, the method also comprises the following step: Remove the shielding foil stripped from the sheathed cable at the predetermined breaking point from a bending gripper that holds the part of the shielding foil that was stripped from the sheathed cable by means of pressurized air and/or suctioning of the stripped shielding foil. The advantage here is that the stripped part of the shielding foil can be removed from the bending gripper and/or the sheathed cable in a technically simple manner.

According to one embodiment, a second part of the sheathed cable is gripped so that the predetermined breaking point is located between the first part of the sheathed cable and the second part of the sheathed cable. This way, the length of the sheathed cable that is being bent can be decreased. In this way, the sheathed cable is protected against unintended damage in a still more reliable manner. Furthermore, under the same tensile/tearing stress, the angle deflection or respectively the bend of the sheathed cable that is required to tear the shielding foil in or along the predetermined breaking point is reduced.

According to one embodiment, the first part of the sheathed cable is moved by means of a gimbal in an elliptical movement. This way, the first part of the sheathed cable can be turned in a particularly easy manner.

According to one embodiment, the first part of the sheathed cable is moved by means of a gimbal in an elliptical movement, so that the center of rotation of the gimbal is located on a level on which the predetermined breaking point of the shielding foil is located. This way, the sheathed cable can tear on the predetermined breaking point in a particularly reliable manner while, at the same time, the part of the sheathed cable that is moved in an elliptical form is moved as little as possible. Consequently, the sheathed cable is protected against undirected damage in a particularly reliable manner.

According to one embodiment, the method also comprises the following step: Create the predetermined breaking point of the shielding foil by means of perforated holes or slits in the shielding foil along the circumference of the shielding foil. One advantage of this is that the predetermined breaking point is created in a technically simple and particularly fast manner.

According to one embodiment an outer part of the shielding foil is slit-perforated in the radial direction of the sheathed cable in an overlapping area of the shielding foil, in which the shielding foil is arranged along a circumference of the sheathed cable in an overlapping manner, and an inner part of the shielding foil is hole-perforated in the radial direction of the sheathed cable at the predetermined breaking point. The advantage of this is that the predetermined breaking point is created in a technically simple manner and that the predetermined breaking point tears in a particularly reliable manner without the formation of tape flags.

According to one embodiment, the foil removal device furthermore comprises an additional gripper to grip a second part of the sheathed cable so that the predetermined breaking point is located between the additional gripper and the bending gripper. This way, the length of the sheathed cable that is being bent can be decreased. In this way, the sheathed cable is protected against unintended damage in a still more reliable manner. Furthermore, under the same tensile/tearing stress, the angle deflection of the sheathed cable that is required to tear the shielding foil in or along the predetermined breaking point can be reduced.

According to one embodiment, the foil removal device furthermore comprises one or more blow-out openings in the bending gripper to blow out a fluid used to detach the shielding foil from the bending gripper and/or a suction device to suction off the shielding foil stripped from the sheathed cable. What is advantageous about this is that the stripped part of the shielding foil can be detached from the bending gripper and/or removed from the sheathed cable in a technically easy manner.

According to one embodiment of the foil removal device, the bending gripper comprises a conical recess that widens in the direction away from the breaking point, in particular a conical recess with an opening angle of the recess of less than or equal to approximately 4°. One advantage this offers is that the bending gripper can hold the sheathed cable or respectively a tip of the sheathed cable in a particularly safe manner.

According to one embodiment, the rotational device is formed so that a direction of rotation of the first part can, when the first part of the sheathed cable is moved along an elliptical, in particular circular, path, be adapted to a winding direction of the shielding foil along a circumference of the sheathed cable. What is advantageous here is that, particularly when the inner part of the shielding foil has a poorer perforation in the overlapping area than the outer part of the shielding foil, the tear at the predetermined breaking point can be reliably transferred to the inner part of the shielding foil. Consequently, the formation of tape flags is prevented with even greater certainty, even in the overlapping area of the shielding foil.

The elliptical movement can be a movement as well that only approximates an ellipse. The elliptical movement can, in particular, be a movement without two focal points, whereby the course of the movement along the path of the movement is always constant i.e. does not make any abrupt jumps. The elliptical movement can also be a sort of gyrating movement.

It should be noted that some of the possible features and advantages of the invention are described here with reference to different embodiments. A person skilled in the art recognizes that the features may be combined, adapted, or exchanged as appropriate in order to yield other embodiments of the invention.

DESCRIPTION OF THE DRAWINGS

Embodiments of the invention are described below with reference to the accompanying drawings, neither the drawings nor the description being intended to be interpreted as limiting the invention.

The drawings are only schematic and are not true to scale. Like reference signs refer in the different drawings to like or analogous features.

DETAILED DESCRIPTION

Figure 1:
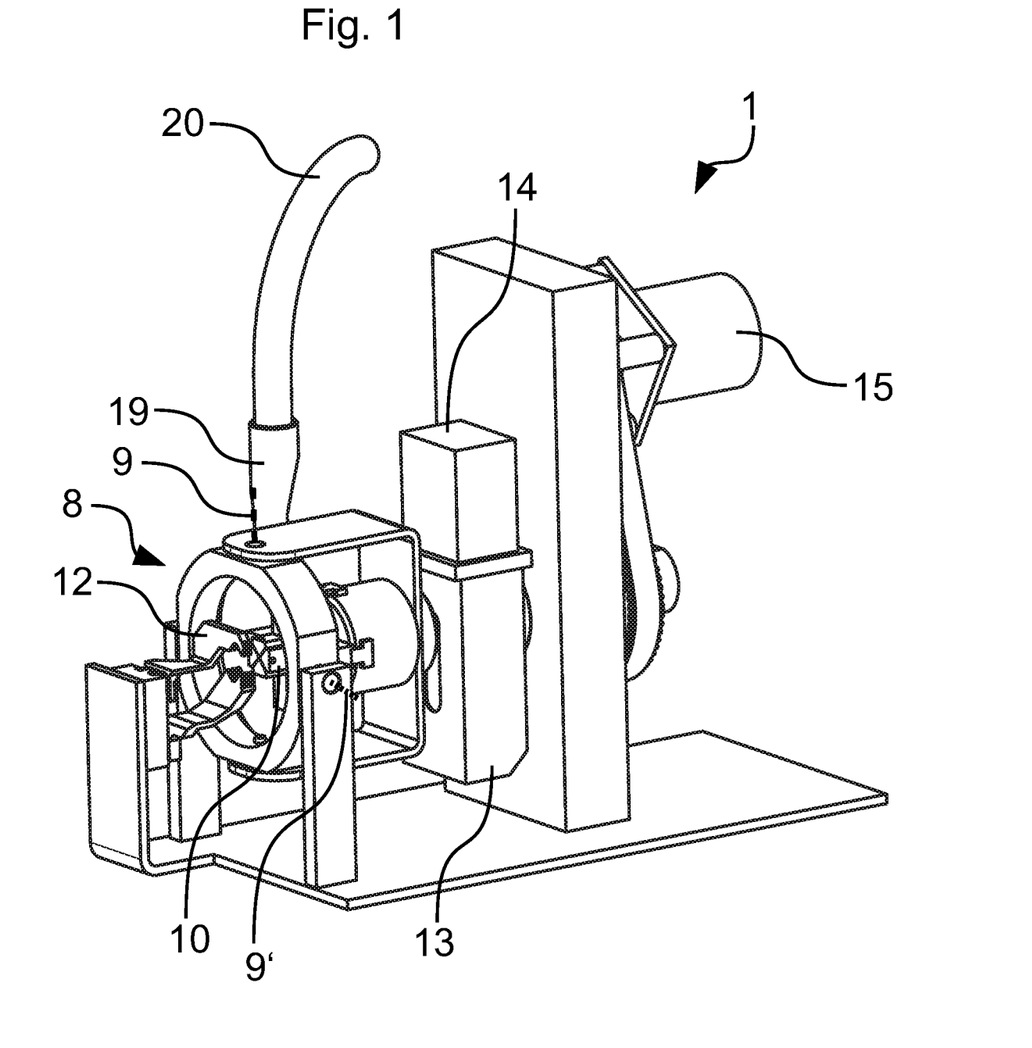
FIG. 1 shows a perspective view of a first embodiment of the foil removal device according to the invention.
Figure 2:
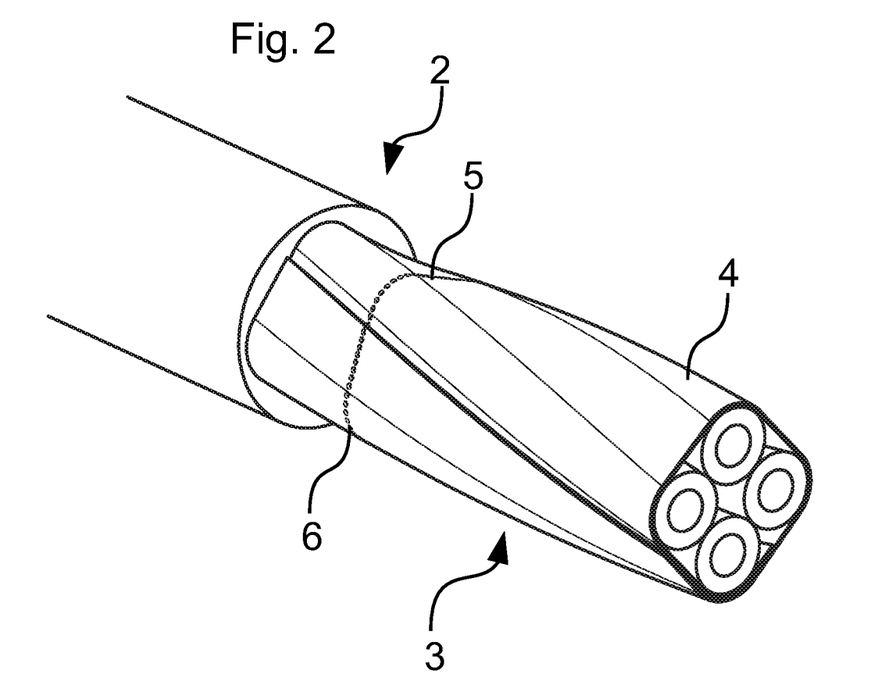
FIG. 2 shows a detailed view of a sheathed cable with a shielding foil comprising a predetermined breaking point.
Figure 3A:
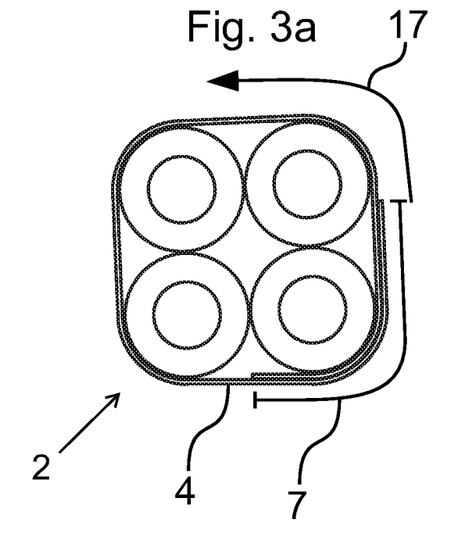
FIG. 3a shows a sectional view of another sheathed cable.
Figure 3B:
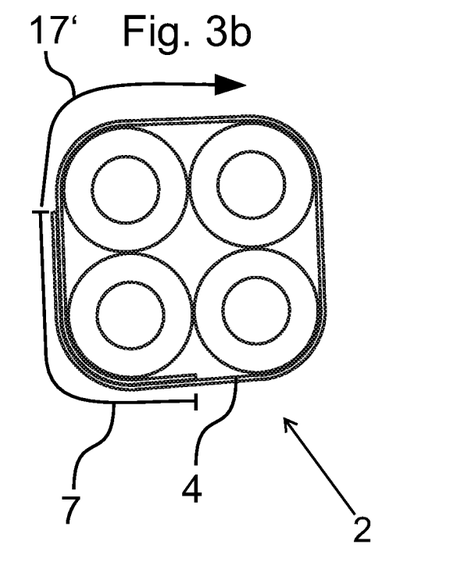
FIG. 3b shows a sectional view of the sheathed cable from FIG. 2.
Figure 4:
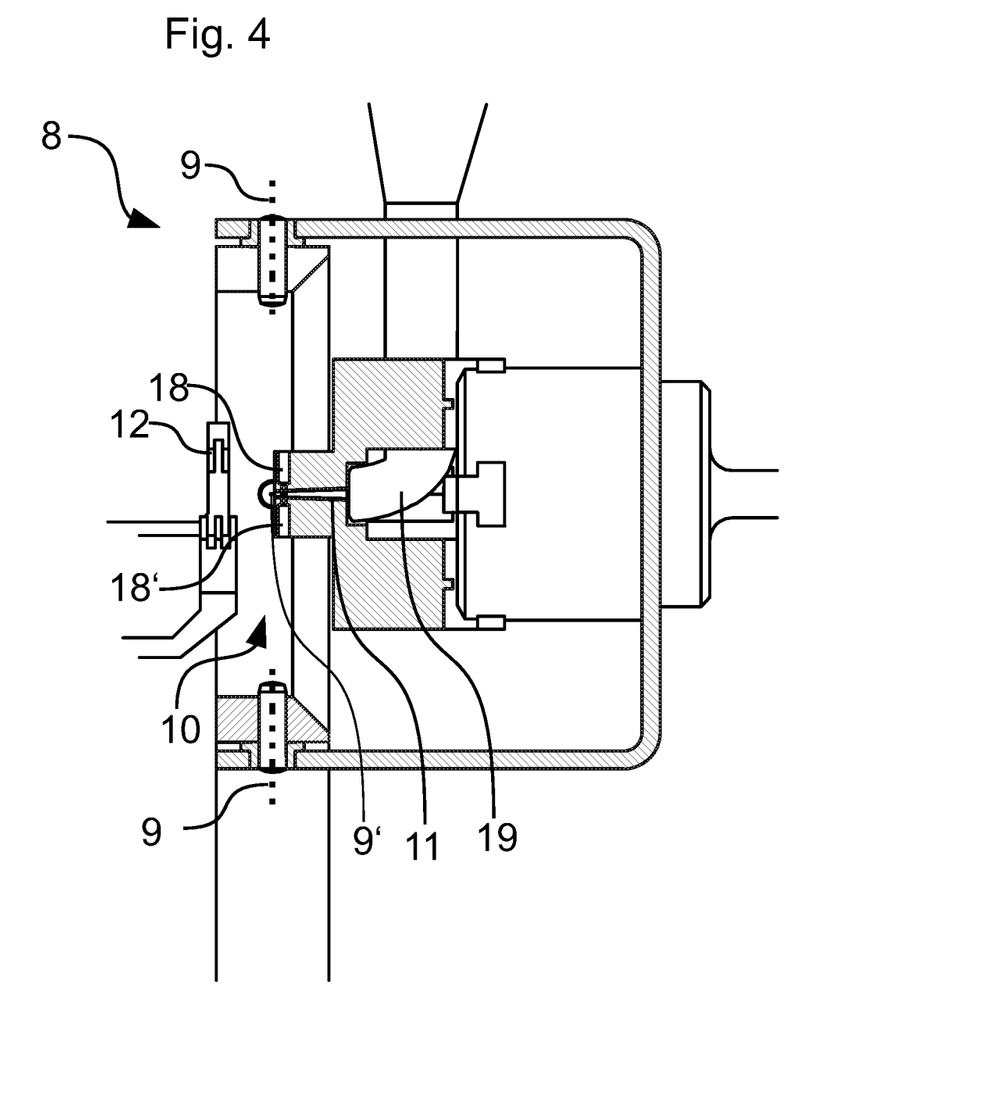
FIG. 4 shows a sectional view of the foil removal device from FIG. 1.

FIG. 1 shows a perspective view of a first embodiment of the foil removal device 1 according to the invention. FIG. 2 shows a detailed view of a sheathed cable 2 with a shielding foil 4 comprising a predetermined breaking point 5. FIG. 3a shows a sectional view of another sheathed cable 2. FIG. 3b shows a sectional view of the sheathed cable 2 from FIG. 2. FIG. 4 shows a sectional view of the foil removal device 1 from FIG. 1.

The foil removal device 1 is configured to remove a part of the shielding foil 4 of a sheathed cable 2. To this purpose, the part of the shielding foil 4 is stripped from the remaining sheathed cable 2 or the remaining part of the shielding foil 4, respectively, that is and remains connected to the sheathed cable 2. The shielding foil 4 contains metal to protect against electromagnetic rays in and/or from the conductors of the sheathed cable 2 that run inside the shielding foil 4. The shielding foil 4 basically encompasses or surrounds the conductors of the sheathed cable 2. The shielding foil 4 is very thin. The shielding foil may, in particular comprise a plastic with an evaporated metal layer, or consist of a plastic with an evaporated metal layer.

A predetermined breaking point 5 is formed at one place and/or one area that primarily runs along the circumference of the shielding foil 4. The predetermined breaking point 5 may, for example, have a slit perforation and/or a hole perforation 6. The predetermined breaking point 5 can be formed by means of a laser beam and/or by means of a mechanical cutting tool. The circumference direction of the shielding foil 4 runs around the four conductors in FIG. 3a or FIG. 3b respectively in the plane of projection.

As shown in FIG. 2, the outer insulation or respectively the layer of the sheathed cable 2 that is arranged in the radial direction outside the shielding foil 4 is partially removed.

The foil removal device 1 comprises a bending gripper 10 to grip and hold the sheathed cable 2. The bending gripper 10 comprises four gripper jaws. The gripper jaws can be moved vertically to the longitudinal direction of the sheathed cable 2, which runs in FIG. 4 from left to right, toward each other to grasp the sheathed cable 2. The gripper jaws can be moved vertically to the longitudinal direction of the sheathed cable 2 away from each other to release the sheathed cable 2.

The bending gripper 10 grasps and/or holds the part of the shielding foil 4 that is to be stripped from the sheathed cable 2.

The gripper jaws may comprise a gripping surface 11, which corresponds to a conical recess in a direction that runs from left to right in FIG. 4. The angle of the truncated cone of the conical recess can be smaller or equal to approximately 4°, e.g. approximately 2° or approximately 3°. The gripping surface 11 of the bending gripper 10 may have a rough surface. The gripper jaws may have an identical or similar form.

The bending gripper 10 is attached by means of a gimbal 8. The axis 9 of the gimbal 8 runs from the top to the bottom in FIG. 4. The further axis 9' of the gimbal which is vertical to axis 9 leaves the plane of projection in FIG. 4. The interface of the two axes 9, 9' of the gimbal 8 is the position where the predetermined breaking point 5 of the shielding foil 4 is configured. In other words, the sheathed cable 2 is arranged in such a way in the foil removal device 1 that the center of rotation of the gimbal 8 of the bending gripper 10 is on a plane where the predetermined breaking point 5 is located or, respectively, that is stretched by the predetermined breaking point 5.

The bending gripper 10 or the gripper jaws, respectively, may have a distance (smallest) of less than approximately 1 mm from the predetermined breaking point 5 (along the longitudinal direction of the sheathed cable 2).

The bending gripper 10 is connected with an extender device 13 by means of another gimbal 8 and/or a ball joint. An extender actuator 14 can move a member of the extender device 13 so that the bending gripper 10, for example while it is holding and/or gripping the sheathed cable 2, rotates (or tilts) around the axis 9' and the sheathed cable 2 is therefore bent.

The foil removal device 1 can optionally comprise an additional gripper 12, which grips and/or holds the one part of the sheathed cable 2. The additional gripper 12 is arranged at such a distance from the bending gripper 10 that the predetermined breaking point 5 can be arranged between the first part of the sheathed cable 2 that is gripped by the bending gripper 10 and the second part of the sheathed cable 2 gripped by the additional gripper 12. By means of the additional gripper 12, a small part of a respectively small section of the sheathed cable 2 can be bent by means of the bending gripper 10. The first part of the sheathed cable 2 can be the sheathed cable tip 3 (FIG. 5a) or a part of the sheathed cable tip 3. The first part of the sheathed cable 2 can furthermore comprise a part of the sheathed cable 2 that directly adjoins the sheathed cable tip 3 and faces away from the bending gripper 10.

Figure 5A:
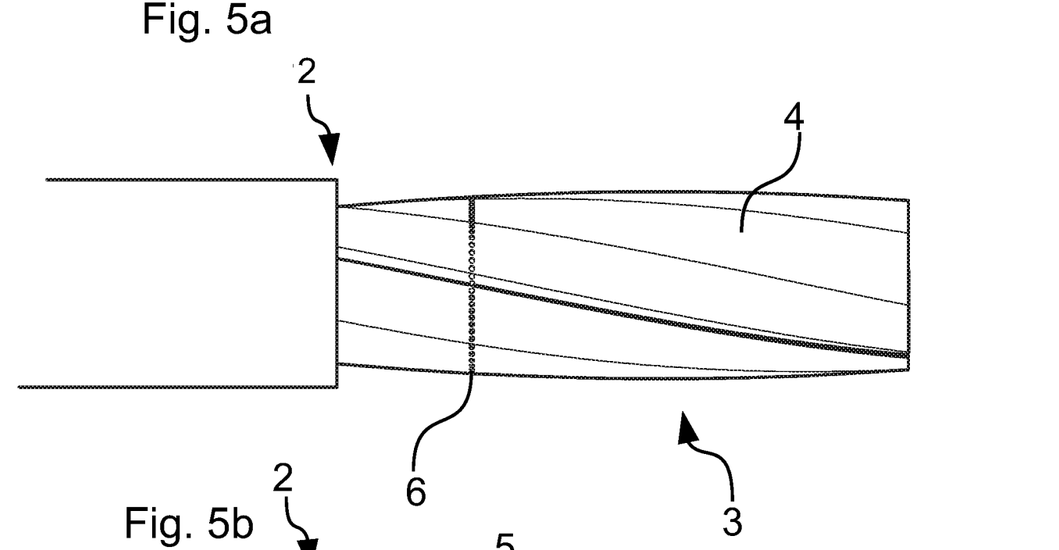
FIG. 5a shows a side view of the sheathed cable from FIG. 2 before it is bent.
Figures 5B, 5C:
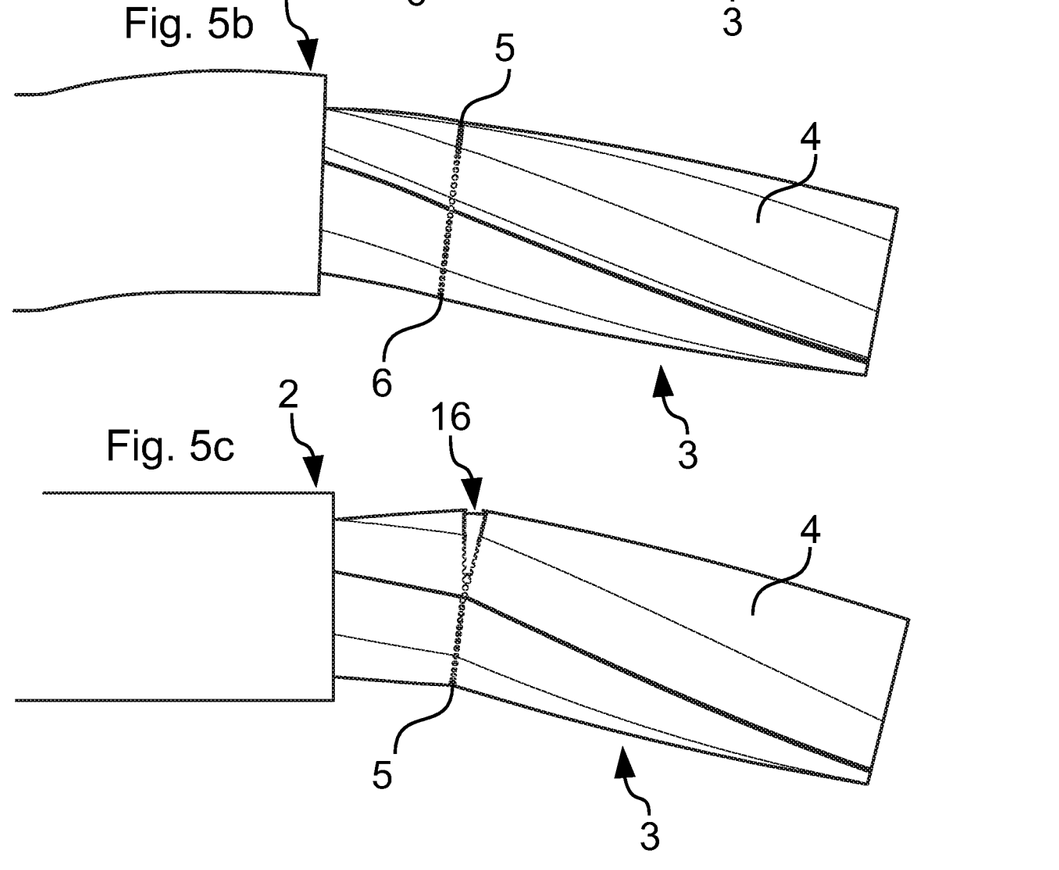
FIG. 5b shows a side view of the sheathed cable from FIG. 5a while it is bent and before the shielding foil tears at a predetermined breaking point.
FIG. 5c shows a side view of the sheathed cable from FIG. 5a or FIG. 5b, respectively, while it is bent and after the shielding foil has torn across some of the circumference of the shielding foil.

FIG. 5a shows a side view of the sheathed cable from FIG. 2 before it is bent. FIG. 5b shows a side view of the sheathed cable from FIG. 5a while it is bent and before the shielding foil tears at a predetermined breaking point 5. FIG. 5c shows a side view of the sheathed cable 2 from FIG. 5a or FIG. 5b, respectively, while it is bent and after the shielding foil has torn across some of the circumference of the shielding foil 4.

The predetermined breaking point 5 is an area that extends primarily along a circumference direction (in FIG. 5a into the plane of projection or, respectively, out of the plane of projection). At the predetermined breaking point 5, the shielding foil 4 is perforated or weakened in another way. The sheathed cable 2 or respectively the shielding foil 4 is gripped in a first part of the shielding foil 4 by the bending gripper 10 and moved in a direction that is at least partially vertical to the longitudinal direction of the sheathed cable 2, which runs from left to right in FIG. 5a, and is thereby bent. A partial of the sheathed cable 2 is therefore bent in that a part of the partial area of the sheathed cable 2 is moved vertical to the direction that runs from left to right in FIG. 5a. FIG. 5b shows the situation of the sheathed cable from FIG. 5b while it is bent and before the shielding foil 4 tears at a predetermined breaking point 5.

It is also conceivable that the sheathed cable 2 is (manually) bent and subsequently gripped and/or held in the bent form by the bending gripper 10. Hereby, the sheathed cable 2 is not gripped in a non-tilted condition and then bent, but the bending gripper 10 is, for example, found already on the elliptical path along which the first part of the sheathed cable 2 is subsequently moved. The first part of the sheathed cable 2 is manually moved accordingly and then held by the bending gripper 10.

The sheathed cable 2 is bent further until a tear 16 has occurred on a part of the circumference of the shielding foil 4. This is shown in FIG. 5c. Now, the sheathed cable 2 is not bent further in the previous direction, i.e. the bending angle is not increased further.

Then, a first part of the sheathed cable 2 that was gripped by the bending gripper 10, as well as a part of the sheathed cable 2 that is at a greater distance from the predetermined breaking point 5 than from the bending gripper 10 is moved in an elliptical movement. In other words: the first part of the sheathed cable 2 that was gripped and held by the bending gripper 10, and the area or part of the sheathed cable 2 that is located between the bending gripper 10 and the additional gripper 12 or the transport slide, is moved in an elliptical movement. No part of the sheathed cable 2 or the shielding foil 4 is twisted here in relation to the rest of the sheathed cable 2.

The elliptical movement may be a circular movement. The angle to which the sheathed cable 2 is bent may be changed during the elliptical movement. This is particularly effective for sheathed cable 2 with an elongated and/or asymmetrical cross section, because this ensures that the tensile stress that is applied is adequate for tearing the shielding foil 4 in the predetermined breaking point 5 and that, at the same time, the sheathed cable 2 is not unintentionally damaged.

By turning the first part of the sheathed cable 2 by means of the bending gripper 10, the tearing stress or the tensile stress, respectively, moves across the entire circumference of the shielding foil 4. The shielding foil 4 tears gradually across the entire circumference of the shielding foil 4 or the sheathed cable 2, respectively.

The bending gripper 10 is used to strip or respectively remove the shielding foil 4 from the sheathed cable 2.

After the part of the shielding foil 4 held by the bending gripper 10 has been torn off and the shielding foil has been removed from the sheathed cable 2, the bending gripper 10 can let go of the part of the shielding foil 4. By means of pressurized air, the shielding foil 4 is detached from the bending gripper 10 or the gripping surfaces 11 of the bending gripper 10, respectively, and can then be suctioned off by means of a suction nozzle 19.

Figure 6A:
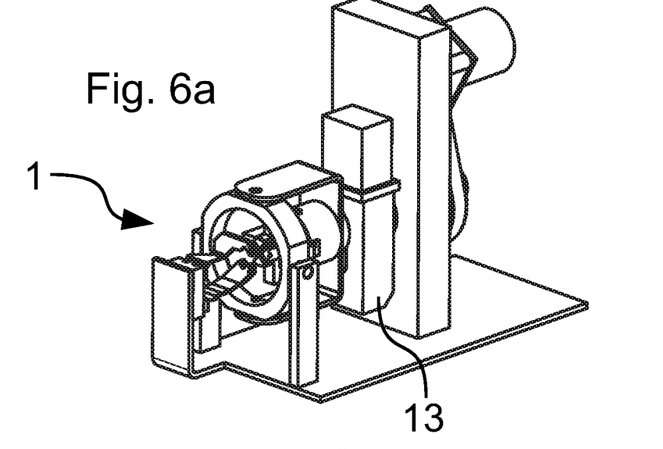
FIG. 6a shows the foil removal device from FIG. 1 with the bending gripper in a home position without a sheathed cable.
Figure 6B:
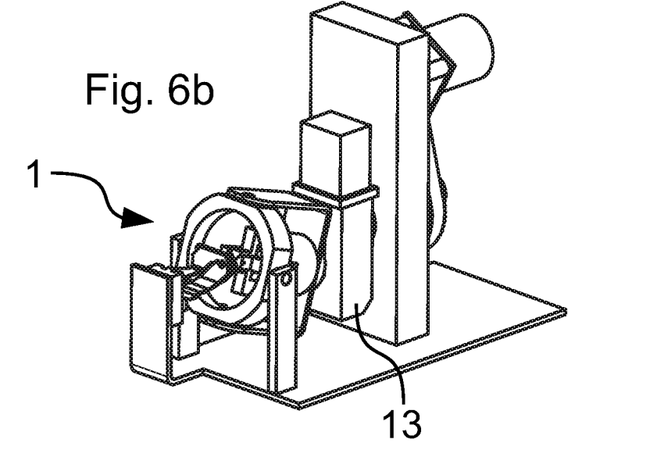
FIG. 6b shows the foil removal device from FIG. 6a after the bending gripper has been rotated from the home position.
Figure 6C:
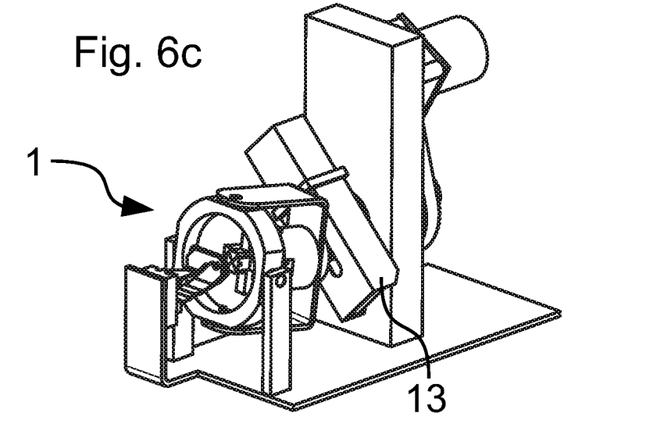
FIG. 6c shows the foil removal device from FIG. 6a or FIG. 6b, respectively, after the bending gripper has been turned.
Figure 6D:
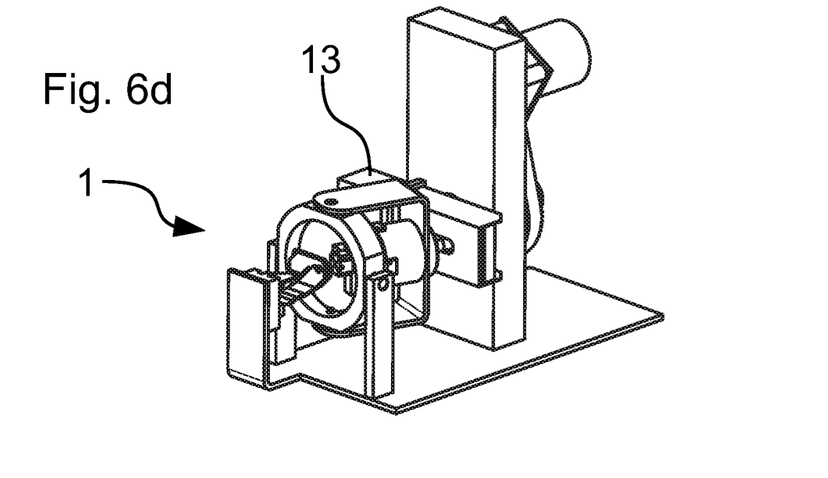
FIG. 6d shows the foil removal device from FIG. 6a or FIG. 6b or FIG. 6c, respectively, after the bending gripper has been turned again.
Figure 6E:
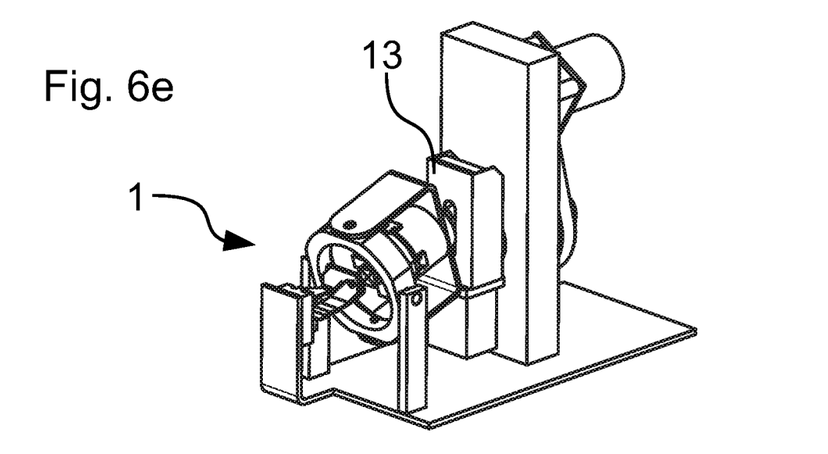
FIG. 6e shows the foil removal device from FIG. 6a or FIG. 6b or FIG. 6c or FIG. 6d, respectively, after the bending gripper has been turned again.

FIGS. 6a-6e show the flow of the process, whereby the sheathed cable 2 is not shown, or respectively cannot be seen in the drawings. FIG. 6a shows the foil removal device 1 from FIG. 1 with the bending gripper 10 in a home position without a sheathed cable 2. The first part of the sheathed cable 2 is held in the home position of the bending gripper 10 along a longitudinal direction, which runs in the direction of the longitudinal direction of the remaining sheathed cable 2. FIG. 6b shows the foil removal device 1 from FIG. 6a, after the bending gripper 10 has been rotated from the home position by the axis 9'. FIG. 6c shows the foil removal device 1 from FIG. 6a or FIG. 6b, respectively after the rotation or gyration of the bending gripper 10. FIG. 6d shows the foil removal device 1 from FIG. 6a or FIG. 6b or FIG. 6c, respectively, after a further rotation or gyration of the bending gripper 10. FIG. 6e shows the foil removal device 1 from FIG. 6a or FIG. 6b or FIG. 6c, respectively, after a further rotation or gyration of the bending gripper 10.

The rotation or gyration, respectively, of the bending gripper 10 is performed by the rotation or gyration, respectively, of the extender device 13 by means of a motor 15.

The bending gripper 10 is first in a home position as shown in FIG. 6a. The extension direction of the sheathed cable 2 is the same at the position of the additional gripper 12 as at the side of the bending gripper 10 facing away from the predetermined breaking point 5.

First, the sheathed cable 2 with the shielding foil 4 comprising a predetermined breaking point 5 is arranged such that the predetermined breaking point 5 is arranged between the bending gripper 10 and the additional gripper 12. If there is no additional gripper 12, a part of the sheathed cable 2 is held by a transport slide. The transport slide can transport the sheathed cable 2 toward the foil removal device 1 and, after the removal of a part of the shielding foil 4 away from the foil removal device 1.

The predetermined breaking point 5 of the shielding foil 4 is arranged at the interface of the axes 9, 9' of the gimbal 8. This means that the sheathed cable 2 is arranged so that the center axis of the sheathed cable 2 runs from the back to the front at the same height as the axis 9' of the gimbal 8 shown in FIG. 4 and that the predetermined breaking point 5 is arranged in FIG. 4 from left to right at the same height of the axis 9 of the gimbal 8 which runs in FIG. 4 from the top to the bottom.

The gripper jaws are moved toward each other to grip the sheathed cable 2 or, respectively, a part of the sheathed cable 2 on which the shielding foil 4 is exposed.

Now, the ball joint that joins the bending gripper 10 with the extender device 13 is moved, i.e. downward as shown in FIG. 6b. This leads to a rotation of the bending gripper 10. In this way, a part of the sheathed cable 2 is bent downward. The deflection or the angle position of the bending gripper 10, respectively, is so strong that the shielding foil 4 tears at the predetermined breaking point 5 on a part of the circumference of the shielding foil 4 or the sheathed cable 2, respectively, due to the tensile stress that is generated, i.e. on the upper side of shielding foil 4, because a part of the sheathed cable 2 is bent downward.

The bending gripper 10 is turned around the center of rotation of the gimbal 8. The angle may, for example, range between approximately 10° to approximately 30°, in particular between approximately 15° and approximately 25°.

The angle may be, for example, approximately 17° to approximately 20°, in particular approximately 18°.

Subsequently, the extender device 13 and therefore also the bending gripper 10 is rotated by means of a motor 15 around the center of rotation of the gimbal 8. The position of the sheathed cable 2 at the predetermined breaking point 5 remains essentially unchanged. The part of the sheathed cable 2 that is directly adjacent to the predetermined breaking point 5 and that faces away from the additional gripper 12 is moved on an elliptical path.

In FIG. 6b to FIG. 6e, the bending gripper 10 is turned in a direction of rotation that, seen from one direction that runs from the additional gripper 12 to the bending gripper 10, is counterclockwise.

The rotation of the bending gripper 10 and the resulting bending of a partial area of the sheathed cable 2 in different directions causes the tensile stress to move across the entire circumference of the shielding foil 4, so that the tear 16 moves along the predetermined breaking point 5 across the circumference of the shielding foil 4, until finally the part of the shielding foil 4 that is held by the bending gripper 10 has been completely torn off the sheathed cable 2 (that is being held by the additional gripper 12).

The sheathed cable 2 is released by the additional gripper 12 and removed by the transport slide. The sheathed cable 2 is removed by the foil removal device 1 in such a way that the bending gripper holds onto the stripped part of the shielding foil 4 and physically separates it from the sheathed cable 2.

Now, the bending gripper 10 opens to no longer hold onto the stripped part of the shielding foil 4.

Now, pressurized air can be blown through pressurized air channels 18, 18' of the gripper jaws or, respectively, a blow-out opening of the bending gripper 10, which causes the part of the shielding foil 4 stripped from the sheathed cable 2 to be detached from the gripping jaws and/or to be removed.

Then, the stripped part of the shielding foil 4 is suctioned off by a suction nozzle 19 and a suction hose 20.

Now, the foil removal device 1 is ready to remove a part of the shielding foil 4 of a sheathed cable 2.

The bending gripper 10 can be rotated around the center of rotation of the gimbal 8 so that it performs a rotation of approx. 360°. To ensure that the shielding foil 4 tears across the entire circumference, it is also conceivable that the bending gripper 10 is rotated by approx. 720°.

The direction of the rotation of the bending gripper 10 may depend on a winding direction 17 of the shielding foil 4. The shielding foil 4 generally has an overlapping area 7. In the overlapping area 7, the shielding foil 4 comprises two layers: one outer layer in relation to the radial direction of the sheathed cable 2 and one inner layer in relation to the radial direction.

In FIG. 3a, the shielding foil 4 has a counter-clockwise winding direction 17. In FIG. 3b, the shielding foil 4 has a clockwise winding direction 17'.

The direction of the rotation of the bending gripper 10 is preferably contrary to the winding direction 17, 17' of the shielding foil 4, so that the tear 16 at the predetermined breaking point 5 is directed toward the bottom part of the shielding foil 4 in the radial direction. If the rotation of the bending gripper 10 has a direction of rotation that matches the winding direction 17, 17' of the shielding foil 4, a second tear 16 may occur under unfavorable circumstances and thus, the risk that tape flags are formed is significantly increased, especially where the two tears intersect. This applies particularly when the lower part of the shielding foil 4 has less or poorer perforation 6 than the upper part of the shielding foil 4 in the overlapping area 7.

In the overlapping area 7, the outer part of the shielding foil in the radial direction may be provided with a slit perforation and the inner part of the shielding foil 4 in the radial direction may be provided with a hole perforation. The slit perforation may comprise or respectively be a long slit across the entire length of the overlapping area 7 along the circumference direction of the shielding foil 4.

The additional gripper 12 may be configured as a prism gripper. In this way, the additional gripper 12 has a greater range in which the cable can be gripped by the additional gripper 12. In addition, a better positioning precision is achieved in this way.

It is conceivable as well that a bending gripper 10 is arranged on an extender device 13, i.e. that the cable is bent manually, fixed in the bending gripper 10 and then the bending gripper 10 is moved in an elliptical movement, in particular a circular movement.

If the sheathed cable 2 is sensitive, in particular sensitive to bending, tensile stress may be applied to the predetermined breaking point 5 before a partial area of the sheathed cable 2 is bent. This way, the bending angle can be reduced.

Finally, it should be noted that terms such as "comprising" and the like do not preclude other elements or steps, and terms such as "a" or "one" do not preclude a plurality. Furthermore, it should be noted that features or steps that have been described with reference to one of the above embodiments may also be used in combination with other features or steps of other embodiments described above.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method for stripping a part of a shielding foil of a sheathed cable, the method comprising the following steps:
    providing the sheathed cable with the shielding foil, whereby the shielding foil includes a predetermined breaking point formed therein that runs along a circumference of the shielding foil;
    bending of a partial area of the sheathed cable with the shielding foil in a first direction to apply a tearing tension at the predetermined breaking point thereby tearing the shielding foil at the predetermined breaking point on a part of the circumference of the shielding foil;
    moving a first part of the sheathed cable in an elliptical movement that circles about a longitudinal direction of the sheathed cable to apply a tearing stress across the circumference of the shielding foil whereby the shielding foil circumferentially tears the predetermined breaking point around the circumference of the shielding foil to strip a part of the shielding foil from the sheathed cable; and
    removing from the sheathed cable the stripped part of the shielding foil.

2. The method according to claim 1 whereby the moving of the first part of the sheathed cable is carried out in a direction of rotation that is contrary to a winding direction of the shielding foil along a circumference of the sheathed cable.

3. The method according to claim 1 including, prior to the step of moving the first part of the sheathed cable, prestressing the shielding foil in a longitudinal direction of the sheathed cable.

4. The method according to claim 1 including adapting to characteristics of the sheathed cable at least one of a length of a bending section in which the sheathed cable is bent by the elliptical movement of the first part of the sheathed cable and a bending angle in which the sheathed cable is bent by the elliptical movement of the first part of the sheathed cable.

5. The method according to claim 1 including removing the shielding foil stripped from the sheathed cable at the predetermined breaking point from a bending gripper that holds the part of the shielding foil that was stripped from the sheathed cable with at least one of pressurized air and suctioning.

6. The method according to claim 1 including gripping a second part of the sheathed cable so that the predetermined breaking point is located between the first part of the sheathed cable and the second part of the sheathed cable.

7. The method according to claim 1 including moving the first part of the sheathed cable with a gimbal in the elliptical movement.

8. The method according to claim 7 including moving the first part of the sheathed cable with the gimbal in the elliptical movement, so that a center of rotation of the gimbal is located on a level on which the predetermined breaking point of the shielding foil is located.

9. The method according to claim 1 including creating the predetermined breaking point of the shielding foil by forming perforated holes or slits in the shielding foil along the circumference of the shielding foil.

10. The method according to claim 9 wherein in an overlapping area of the shielding foil, in which the shielding foil overlaps along the circumference of the sheathed cable, an outer part of the shielding foil is slit-perforated at the predetermined breaking point and an inner part of the shielding foil is hole-perforated at the predetermined breaking point in a radial direction of the sheathed cable.

11. A foil removal device for stripping a part of a shielding foil of a sheathed cable from the sheathed cable at a predetermined breaking point, comprising:
a bending gripper for gripping a first part of the sheathed cable and for holding the gripped first part of the sheathed cable so that the sheathed cable is at least in a partially bent state creating a tearing stress at the predetermined breaking point on a part of a circumference of the shielding foil; and
a rotation device for rotating the bending gripper to move the first part of the sheathed cable along an elliptical path that circles about a longitudinal direction of the sheathed cable to create a tearing tension across the circumference of the shielding foil, whereby the shielding foil circumferentially tears the predetermined breaking point around the circumference of the shielding foil to strip the part of the shielding foil.

12. The foil removal device according to claim 11 including an additional gripper for gripping a second part of the sheathed cable wherein the predetermined breaking point is located between the additional gripper and the bending gripper.

13. The foil removal device according to claim 11 including at least one of a blowing out opening in the bending gripper for blowing out a fluid to detach the shielding foil from the bending gripper and a suction device to suction off the part of the shielding foil stripped from the sheathed cable.

14. The foil removal device according to claim 11 wherein the bending gripper includes a conical recess that widens in a direction away from the predetermined breaking point.

15. The foil removal device according to claim 14 wherein the conical recess has an opening angle of less than or equal to approximately 4°.

16. The foil removal device according to claim 11 wherein the rotational device is formed so that a direction of rotation of the first part of the sheathed cable, when the first part of the sheathed cable is moved along the elliptical path, is adapted to a winding direction of the shielding foil along a circumference of the sheathed cable.

17. A method for stripping a part of a shielding foil of a sheathed cable, the method comprising the following steps:
providing the sheathed cable with the shielding foil, whereby the shielding foil includes a predetermined breaking point formed therein that runs along a circumference of the shielding foil;
bending of a partial area of the sheathed cable with the shielding foil in a first direction to apply a tearing tension at the predetermined breaking point thereby tearing the shielding foil at the predetermined breaking point on a part of the circumference of the shielding foil;
moving a first part of the sheathed cable in an elliptical movement that circles about a longitudinal direction of the sheathed cable to apply a tearing stress across the circumference of the shielding foil whereby the shielding foil circumferentially tears the predetermined breaking point around the circumference of the shielding foil to strip a part of the shielding foil from the sheathed cable wherein the first part of the sheathed cable is not twisted in relation to a remainder of the sheathed cable during the elliptical movement; and
removing from the sheathed cable the stripped part of the shielding foil.

* * * * *